United States Patent [19]

Murakoshi et al.

[11] Patent Number: 5,373,158
[45] Date of Patent: Dec. 13, 1994

[54] FIELD-EMISSION TRANSMISSION ELECTRON MICROSCOPE AND OPERATION METHOD THEREOF

[75] Inventors: Hisaya Murakoshi, Tokyo; Mikio Ichihashi, Kodaira, both of Japan

[73] Assignee: Hitachi, Ltd., Tokyo, Japan

[21] Appl. No.: 69,838

[22] Filed: Jun. 1, 1993

[30] Foreign Application Priority Data

Jun. 5, 1992 [JP] Japan ............... 4-145128

[51] Int. Cl.⁵ .......................................... H01J 37/26
[52] U.S. Cl. .................................. 250/311; 250/307; 250/396 R
[58] Field of Search ............... 250/310, 311, 307, 306, 250/396 R, 397

[56] References Cited

U.S. PATENT DOCUMENTS

| | | | |
|---|---|---|---|
| 3,795,809 | 3/1974 | Takashima | 250/311 |
| 3,887,835 | 6/1975 | Nomura | 250/311 |
| 4,099,055 | 7/1978 | Todokoro | 250/311 |
| 4,210,806 | 7/1980 | Broers | 250/311 |
| 4,246,487 | 1/1981 | Anger et al. | 250/311 |
| 4,713,543 | 12/1987 | Feuerbaum et al. | 250/310 |
| 4,880,977 | 11/1989 | Tomita et al. | 250/311 |
| 5,013,913 | 5/1991 | Benner | 250/307 |

FOREIGN PATENT DOCUMENTS 55-126951 10/1980 Japan .
55-128243 10/1980 Japan .
60-117534 6/1985 Japan .

Primary Examiner—Jack I. Berman
Assistant Examiner—James Beyer
Attorney, Agent, or Firm—Fay, Sharpe, Beall, Fagan, Minnich & McKee

[57] ABSTRACT

An object of the present invention is to realize a field-emission transmission electron microscope which is able to cope with both observation of an electron-microscopic image of a high brightness and microanalysis. A low aberration condenser lens 4 is disposed at the farthest position from a specimen 7, and a short focal length lens 5 is disposed at the midpoint between the specimen 7 and the condenser lens 4. In the case of an observation of an electron-microscopic image, the condenser lens unit is operated for enlargement in which the condenser lens 4 and the condenser lens 5 are driven in an interlocking motion. When the size of a beam spot on a specimen is to be reduced, a condenser lens 6 disposed close to the specimen between the condenser lens 5 and the specimen 7 is driven to make the condenser lens unit be operated for reduction. The coexistence of a small illuminating angle and the illumination of a specimen with a fine beam spot is realized, which makes it possible for a field-emission transmission electron microscope to have both functions, being able to observe a bright electron microscopic image and to perform an element analysis.

4 Claims, 3 Drawing Sheets

FIELD-EMISSION TRANSMISSION ELECTRON MICROSCOPE AND OPERATION METHOD THEREOF

BACKGROUND OF THE INVENTION

1. Field of the Invention

The present invention relates to a field-emission transmission electron microscope. To be more precise, it relates to a field-emission transmission electron microscope comprising an electrostatic lens for extracting electrons from a field-emission cathode and for accelerating the electrons with a predetermined accelerating voltage. Additionally, a condenser lens for focusing the accelerated electron beam and illuminating a specimen with the focused electron beam is provided. The invention relates, in particular, to the constitution and the operation method of the condenser lens portion.

2. Description of the Related Art

In the case of a conventional transmission electron microscope, for example, a thermionic electron source in which thermionic electrons are emitted from tungsten W or $LaB_6$ being heated, or a field-emission electron source in which electrons are extracted from a hairpin cathode having a small radius of curvature with a strong electric field applied to it, is used as an electron source for generating an electron beam.

In the case of an electron microscope using a thermionic electron source, an electron source diameter of the thermionic electron source is as large as 2 to 10 μm, and in an observation with high magnification, in order to make an area on a specimen to be illuminated by an electron beam be less than 1 μm, the magnification of the illumination system shall be less than 1. An example of such a case is described in a Japanese Patent laid open under Provisional Publication No. 126951/80.

In the case of an electron microscope using a field-emission electron source, the illumination system is constituted with an electrostatic lens and a single condenser lens. An example of such a case is described in Japanese Patent Publication No. 117534/85.

In recent years, there has been a demand for a transmission electron microscope having functions both of observation of high resolution imaging and of microanalysis. In a conventional transmission electron microscope using a thermionic electron source, the magnification of an illumination system becomes less than 1 in both cases. Because the size of a thermionic electron source is as large as 2 to 10 μm, reduction of the source size is necessary to prevent a decrease in the brightness of an image in the case of an observation with high magnification, and reduction of the source size to a large extent is needed in the case of microanalysis. However, because of the insufficiency in the brightness of an electron source, it is almost impossible to make the diameter of an electron beam on a specimen less than 10 nm in order to obtain a necessary probe current for an analysis.

On the other hand, in the case of a field-emission transmission electron microscope mounted with a field-emission electron source which has higher brightness and a smaller source size than the case of a thermionic electron source, there is a possibility of having a function of analyzing a small area and a function of an observation of high resolution imaging. In order to realize these two functions, observation of high resolution imaging and microanalysis, it is necessary to make the magnification of an illumination system less than 1 in the case of microanalysis, and to make the magnification of the illumination system more than 1 in the case of observation of high resolution imaging. In other words, in the case of a field-emission electron source, the electron source size is as small as about 10 nm; however, in order to perform a microanalysis of a small area on a specimen in reducing an electron beam diameter, for example, down to less than 1 nm on the specimen, it is necessary to make the magnification of the illumination system be less than 1/10. On the other hand, it is necessary to make an illuminating angle on a specimen small to obtain a high resolution electron microscopic image.

As shown in FIG. 2, let us assume that an electron beam extracted at an extracting voltage of V1 from a field-emission electron source 1 is accelerated to an accelerating voltage V0 by an electrostatic lens 2 and is focused on a specimen 7 by a condenser lens 8; let a symbol $\alpha$ indicate an exit half angle of an electron source to be limited by an aperture 9 and let a symbol $\beta$ indicate an illuminating angle on a specimen, then the magnification of the illumination system M is expressed as, according to the Helmholtz equation, $$M = \alpha/\beta \, (V1/V0)^{0.5}.$$

Let a symbol $\omega$ indicate the angular current density (emission current per unit solid angle) of the field-emission cathode 1, then a beam current I to be limited by the aperture 9 is expressed as $I = \pi \alpha^2 \omega$.

When tungsten W of bearing [310] is used as the field-emission cathode 1, the maximum angular current density $\omega$ is about 50 μA/sr. In order to obtain a bright enlarged image on a fluorescent screen, a beam current of the order of I = 4nA is necessary, and the symbol $\alpha$ to satisfy the condition is calculated to be $\alpha = 5$ mrad. An extracting voltage is usually in the range of 4 kV to 6 kV. Assuming that an extracting voltage V1 = 6 kV, accelerating voltage V0 = 200 kV, and $\alpha = 5$ mrad, the magnification M of the illumination system is $$M = 0.86/\beta \text{ (where the unit of } \beta \text{ is mrad).}$$

Therefore, in order to obtain an illuminating angle $\beta$ of less than 0.5 mrad being necessary for a high resolution observation, the magnification M has to be made as large as possible.

In a conventional example, however, a condenser lens 8 is a single condenser lens, so that it is impossible to change magnification by a large extent from reduction to enlargement using the condenser lens 8. Because of this, when a lens is disposed in a position capable of obtaining an electron beam of less than 1 nm (suitable for microanalysis) in an observation with high magnification, sufficiently large magnification cannot be obtained; thereby, an illuminating angle of less than 0.5 mrad cannot be obtained, which makes it impossible to perform a high resolution observation. In contrast with this, when a lens is disposed in a position to be able to obtain a large magnification, microanalysis of a minute portion of less than 1 nm becomes impossible. Therefore, in the case of an example of a conventional field-emission transmission electron microscope, it is impossible to deal with both cases, high resolution observation and microanalysis, with a single condenser lens.

SUMMARY OF THE INVENTION

An object of the present invention is to realize a field-emission transmission electron microscope which is able to deal with both cases, observation of an electron microscopic image having high brightness and microanalysis.

In order to achieve the above-mentioned object, the present invention offers a field-emission transmission electron microscope comprising: an electrostatic lens which extracts electrons from a field-emission cathode and accelerates the electrons to a desired accelerating voltage; an illuminating means for illuminating a specimen with a focused electron beam which is obtained by focusing the accelerated electrons with a condenser lens unit being composed of a plurality of lenses; and a driving means for selectively combining the above-mentioned lenses for making the magnification of the lens unit to be used for enlargement and also for reduction.

A preferable constitution of the above-mentioned plurality of lenses is shown in the following: the lenses form a compound condenser lens of at least three stages comprising a first condenser lens disposed farthest from a specimen, a second condenser lens having a short focal length disposed about at the midpoint between the specimen and the first condenser lens, and a third condenser lens of a low aberration constant disposed between the second condenser lens and the specimen.

In the operation of the above-mentioned field-emission transmission electron microscope, in the case of an observation of an electron microscopic image of the above-mentioned specimen, the first and the second condenser lenses are driven simultaneously in an interlocking motion to make the magnification of the compound condenser lens be more than 1. In a case where X-ray analysis, etc. are performed in reducing the size of an electron beam spot on the specimen down to a fine spot, the third condenser lens is driven to make the magnification of the compound condenser lens unit be less than 1.

In the case of a thin equivalent magnetic lens which is generally used as a condenser lens, let a symbol D indicate an average value of apertures provided on an upper side magnetic pole and a lower side magnetic pole, and let a symbol S indicate the distance between the upper side magnetic pole and the lower side magnetic pole, then a focal length f and a spherical aberration constant Cs can be approximately expressed as $$f/(S+D) = 25/Ex^2 \tag{1}$$

where lens excitation $Ex = (NI)/(\Phi_0)^{0.5}$, $$Cs = 5.0 f_3/(S+D)^2 \tag{2}$$

where $\Phi_0$ is an accelerating voltage for an electron beam (unit: volt), and NI is the ampere-turns of a lens coil. As seen from equation (1), a lens of a shorter focal length can be obtained for a smaller value of (S +D), when the lens excitation Ex is a constant, and from equation (2), a lens of a smaller spherical aberration constant can be obtained for a larger value of (S+D), when the focal length is a constant.

As described in the above, in the case of a field-emission transmission electron microscope according to the present invention, a condenser lens unit has a 3 stage constitution: a low aberration condenser lens is disposed at a farthest position from a specimen, and a short focal length condenser lens is disposed at the midpoint between the above-mentioned low aberration condenser lens and the specimen. Further, in a case of an observation of an electron microscopic image, the above-mentioned low aberration condenser lens and short focal length condenser lens are operated in an interlocking motion, and the magnification of the condenser lens unit is operated for enlargement. When an electron beam is to be reduced down to a fine spot on the specimen, another low aberration lens disposed close to the specimen between the above-mentioned short focal length lens and the specimen is driven to make the magnification of the condenser lens unit be operated for reduction. Owing to the above-mentioned constitution, it is made possible to realize a field-emission transmission electron microscope which is able to deal with both observation of an electron microscopic image of high brightness and element analysis.

DESCRIPTION OF PREFERRED EMBODIMENTS

An embodiment according to the present invention will be explained in detail without reference to the accompanying drawings.

Figure 1:
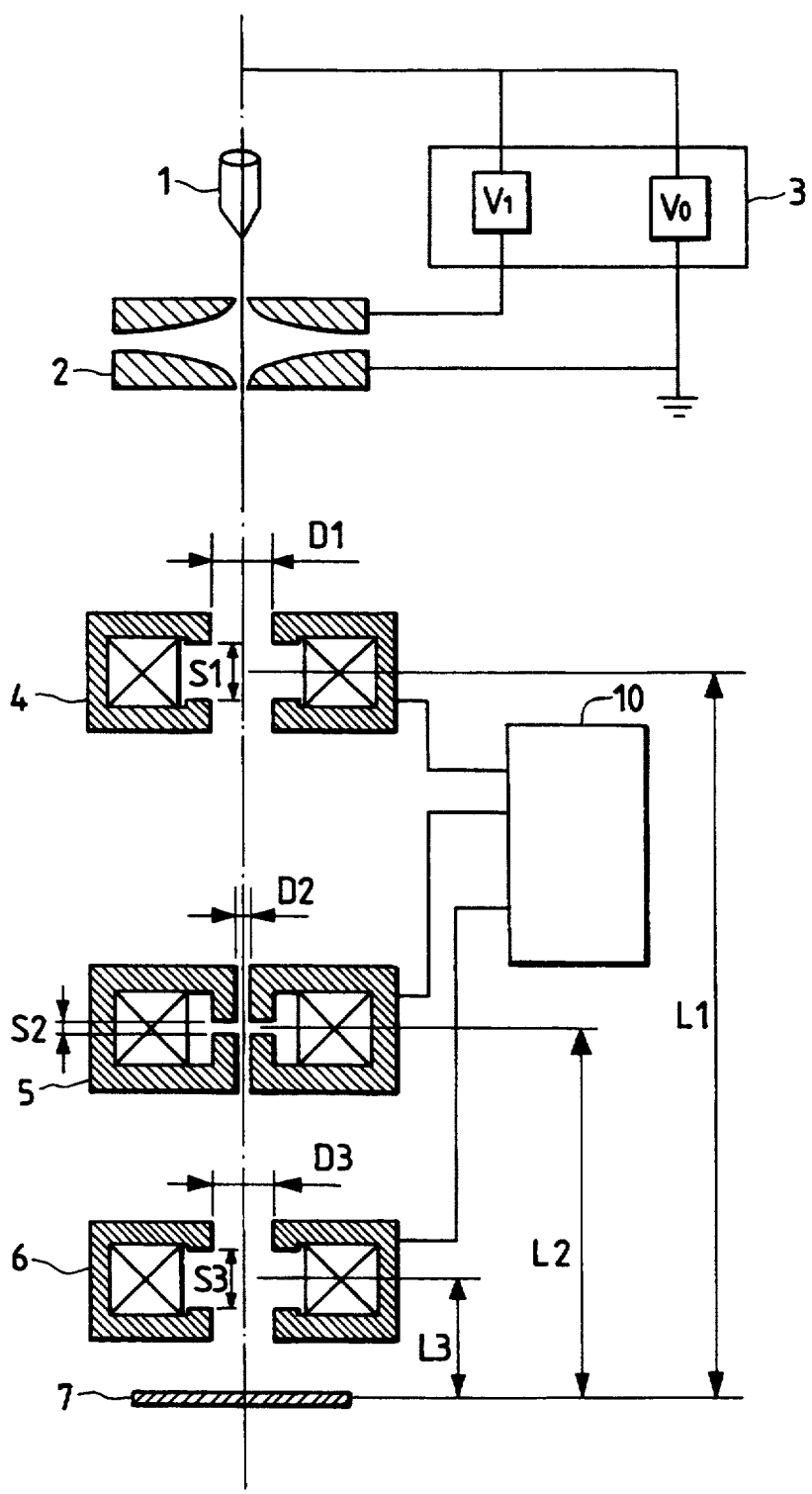
FIG. 1 is a drawing showing the constitution of an embodiment of a field-emission transmission electron microscope according to the present invention.
Figure 2:
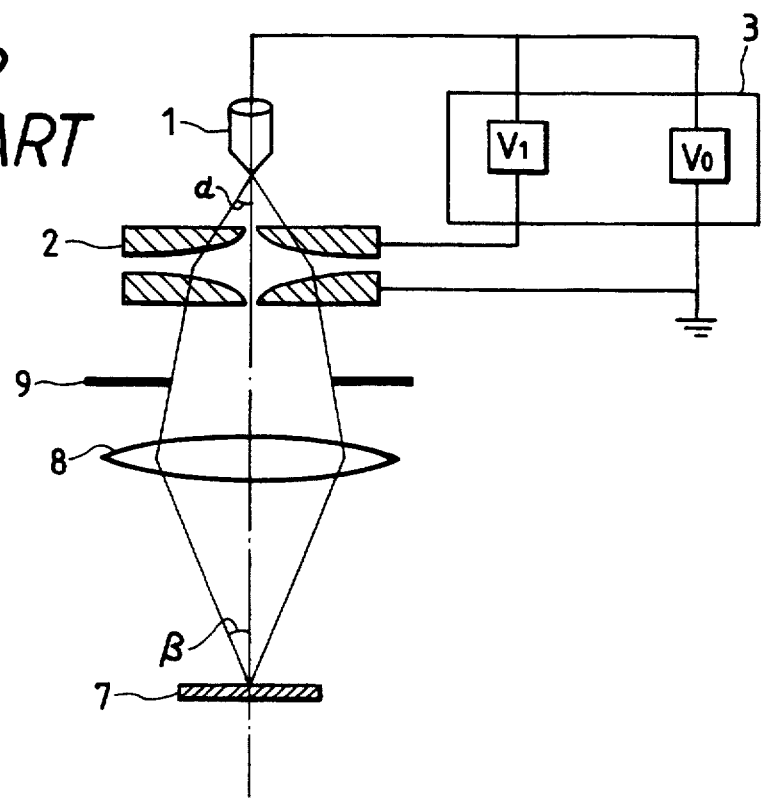
FIG. 2 is a drawing showing a general constitution of an illumination system of a field-emission transmission electron microscope.

FIG. 1 is a drawing showing the constitution of an essential part of a first embodiment of a field-emission transmission electron microscope according to the present invention. An electron beam extracted from a field-emission electron source 1 is accelerated to an accelerating voltage V0 and illuminates a specimen 7 through a condenser lens unit. The condenser lens unit is constituted with, starting from the farthest position from the specimen 7, a first condenser lens 4, a second condenser lens 5, and a third condenser lens 6. These 3 lenses, 4, 5 and 6, are driven by a driving means 10 being selectively combined.

Figure 3:
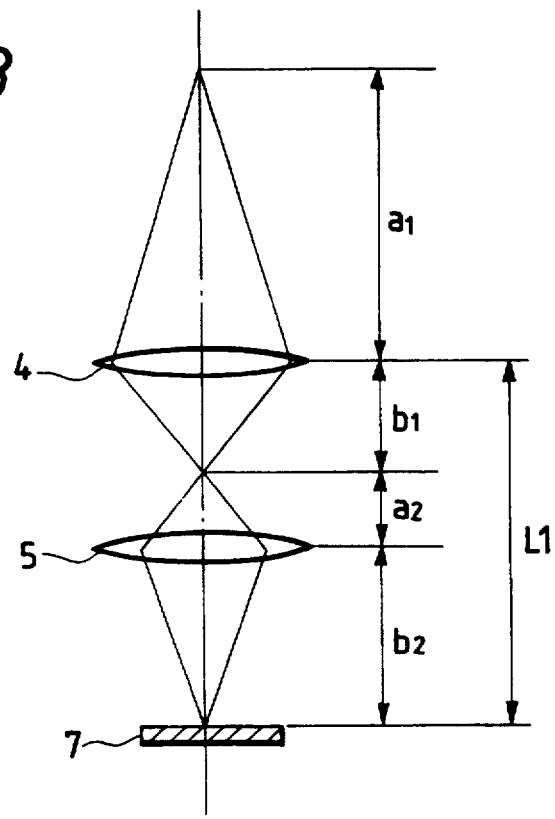
FIG. 3 is a lay diagram showing the operation of an illumination system for the explanation of the principle of the present invention.

FIG. 3 is a lay diagram for explaining the operation principle of the above-mentioned embodiment. At first, a case where a condenser lens unit is used for enlargement will be explained. As shown in FIG. 3, let symbols $a_1$, $b_1$ and $f_1$ indicate the distance between the object surface of the lens 4 and the lens, the distance between the image surface of the lens 4 and the lens, respectively; the focal length of the lens 4, and let symbols $a_2$, $b_2$ and $f_2$ indicate the distance between the object surface of the lens 5 and the lens, the distance between the image surface of the lens 5 and the lens, and the focal length of the lens 5, respectively and let a symbol L1 indicate the distance between the lens 4 and the specimen. Then the magnification Mc of an illumination system, under the condition that an electron beam can be focused on the specimen 7 with the first condenser lens 4, farthest from the specimen, and the second condenser lens 5, second farthest from the specimen, can be expressed as $$Mc = (1/a_1) \times (b_2/a_2) = (1/a_1)$$
$$\{(-1/f_2)b_2^2 + (L1/f_2)b_2 - L_1)\} \tag{3}$$

When equation (3) is partial-differentiated with respect to $b_2$, $$\partial Mc/\partial b_2 = (1/a_1 f_2)(L1-2b_2).$$

Therefore, when $b_2 = 2/L1$, the magnification Mc of an illumination system becomes a maximum value, $(L1/a_1 f_2) \times (L1/4 - f_2)$. In other words, if the focal length of the lens 5 is under the same condition, a maximum magnification can be obtained when the lens 5 is disposed at the midpoint between the lens 4 and the specimen. A larger magnification can be obtained when the lens 4 is disposed farther from the specimen and the lens 5 is used at a shorter focal length. The value of lens excitation Ex has an upper limit decided by magnetic saturation of the magnetic path of a lens, so that to obtain a focal length that is as short as possible, it is advantageous to use a lens having a smaller value of (S+D), which makes the focal length shorter for the same lens excitation Ex. The lens aberration of the lens 4 is enlarged by the lens 5, so that it is desirable to use a lens having as low an aberration constant as possible as the lens 4. To be concrete, less than several tens of mm is desirable.

Next, the case where the size of an electron beam spot on a specimen is reduced will be explained. When the spot size is significantly reduced in the last stage lens, the lens aberration in the preceding stages is also much reduced; therefore, the only lens aberration of note is that of the last stage lens. If an illumination system is composed of only the first and the second condenser lenses, 4 and 5, the last stage lens is the second lens 5. In this case however, when the second condenser lens 5 is a small lens having a short focal length, as seen from equation (2), since spherical aberration becomes larger in the case of a smaller lens, a fine spot on a specimen cannot be obtained.

Therefore, in order to obtain a fine spot, it is necessary to provide another low aberration lens, in addition to the second condenser lens, having a short focal length. When the condenser lens is disposed as close as possible to a specimen, the magnification of the condenser unit becomes small and the focal length becomes also small; thereby lens aberration is made small. If a third condenser lens 6 is disposed between the second condenser lens 5 and the specimen 7 at a position as close as possible to the specimen, and the third condenser lens 6 is a low aberration lens having a large value of (S+D), then a minute spot with little lens aberration can be obtained on the specimen.

Next, the explanation of the embodiment shown in FIG. 1 will be given.

When a distance L1, the distance between the condenser lens 4 and the specimen 7, is longer, larger magnification can be obtained; however, considering the height of a device, L1 chosen to be 300 mm in this case. The condenser lens 5 is disposed at the midpoint of the distance L1, and then the distance L2 between the condenser lens 5 and the specimen 7 is 150 mm. The condenser lens 6 is disposed close to the specimen 7; the distance L3 between the condenser lens 6 and the specimen 7 is 50 mm in this case. Let symbols S1, S2 and S3 indicate the distances between the upper side magnet poles and the lower side magnet poles of the condenser lenses, 4, 5 and 6, and let symbols D1, D2 and D3 indicate the average aperture diameters of upper side magnet poles and the lower side magnet poles. In order to make the focal length of the condenser lens 5 as short as possible, the value of (S2+D2) has to be made small; in this case, (S2+D2) is made to be 10 mm. In order to make the lens aberration of the condenser lens 4 and the condenser lens 5 small, they are made large in size. In this case, they are made to be $S1+D1=S3+D3=50$ mm.

An electron beam extracted from the field-emission electron source 1 is subjected to a lens action of the electrostatic lens 2. Since the electrostatic lens 2 has a large lens aberration constant, in general, it is used in a way to make the influence of the lens action weak; it is used under the condition that a virtual image is focused behind the electron source 1 at a distance in the range of 100 mm to 2000 mm. The distance between the condenser lens 4 and the electrostatic lens 2 has to be long enough to have a space to accelerate an electron beam up to a desired accelerating voltage; usually a distance of more than 500 mm is considered to be necessary for the above-mentioned distance. In this case, the following calculations are performed assuming that the distance a1 between the condenser lens 4 and the focusing position of the electrostatic lens 2 is 1000 mm.

When a compound lens is used for enlargement, condenser lenses 4 and 5 are driven simultaneously. Assuming that the maximum value of the lens excitation Ex of the condenser lens 5 is 10, from equation (1), the minimum focal length of the condenser lens 5 is obtained as $f = 2.5$ mm; the magnification Mc, when the condenser lenses 4 and 5 are used for enlargement, can be obtained from equation (3) as $Mc = 8850$ a1 $= 8.85$.

When the position of the condenser lens 5 is shifted by 10% from the midpoint between the condenser lens 4 and the specimen 7, that is, when $L2 = 0.4$ and $L1 = 120$ mm, and when $L2 = 0.6$ and $L1 = 180$ mm, the values of Mc, in respective cases, are found to be $Mc = 8.46$ and $Mc = 8.52$; the magnification is decreased by about 5%, but in an actual mounting, when it is not possible to mount the condenser lens 5 at the midpoint, it can be disposed at a position in the range of $L2 = 0.5 (1 \pm 0.1)$.

When it is desirable to shift the position of the condenser lens 5 further, it can cope with further reduction of the size of the condenser lens 5. When the size of the condenser lens 5, (S2+D2), is made to be 8 mm, the minimum focal length f of the condenser lens 5 can be obtained from equation (1) as $f = 2$ mm; even when $L1 = 300$ mm and $L2 = 220$ mm, the magnification of the condenser lens unit Mc can be obtained as $Mc = 8580$ a1 $= 8.58$; thus, the deterioration in the magnification caused by the shift in the position of the condenser lens 5 from the midpoint between the specimen 7 and the condenser lens 4 can be handled with further reduction of the size of the condenser lens 5.

In order to make a beam spot formed on the specimen 7 as small as possible, the condenser lens 6 is driven. When the condenser lens 6 is driven alone, the magnification Mc becomes as $Mc = b_2/(a1 + 250) = 0.04$, and it is made possible to reduce the size of the electron source 1 to a fine spot on the surface of the specimen 7.

When the reduction ratio at the condenser lens 6 is made large and the accelerating voltage is high, the lens aberration d on the specimen 7 is approximately decided by the spherical aberration and the diffraction aberration of the condenser lens 6. Let the symbol $\beta$ indicate an illuminating angle on the specimen 7, let a symbol Cs indicate a spherical aberration constant of the condenser lens 6, and let a symbol $\lambda$ indicate the wavelength of an electron beam. Then, the spherical lens aberration and diffraction lens aberration, ds and dλ are obtained as ds=0.5 Cs$\beta^3$, and dλ=0.61 λ/$\beta$, respectively. The lens aberration d is determined by calculating the square root of the sum of the square of ds and the square of dλ, and the minimum value dmin is obtained as $$d_{min} = 0.77\, Cs^{\frac{1}{4}}\lambda^{\frac{3}{4}}. \tag{4}$$

When the above value is applied to equation (2), Cs is obtained as Cs=250 mm. For example, when the value of λ=0.0025 nm at the accelerating voltage of 200 kV is applied to equation (4), dmin is obtained as dmin=1.08 nm; thus, when a low aberration lens is used as the condenser lens 6, the value of lens aberration becomes very small.

Figure 4A:
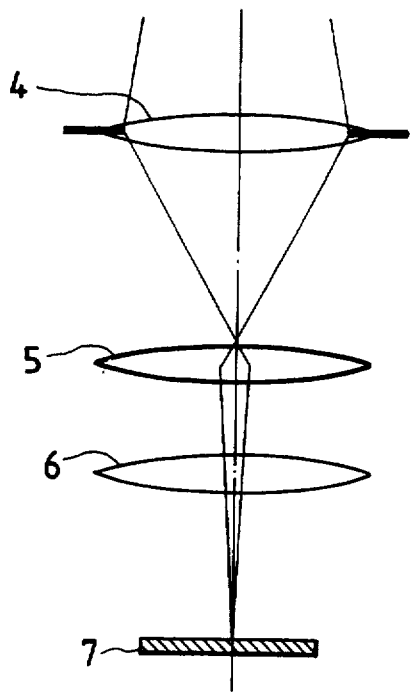
FIGS. 4(A)-4(D) show the operation of an embodiment of a field-emission transmission electron microscope according to the present invention.
Figure 4B:
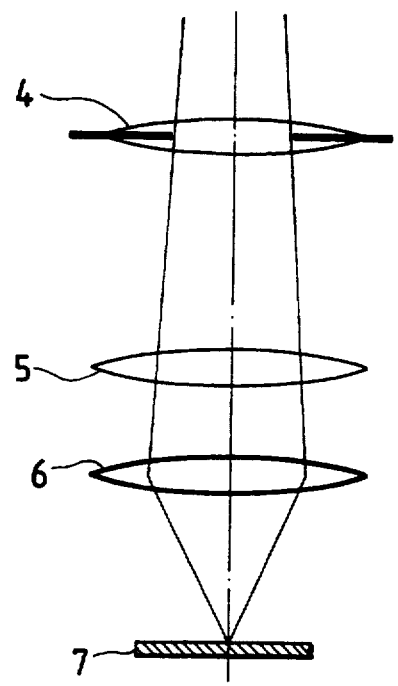
Figure 4C:
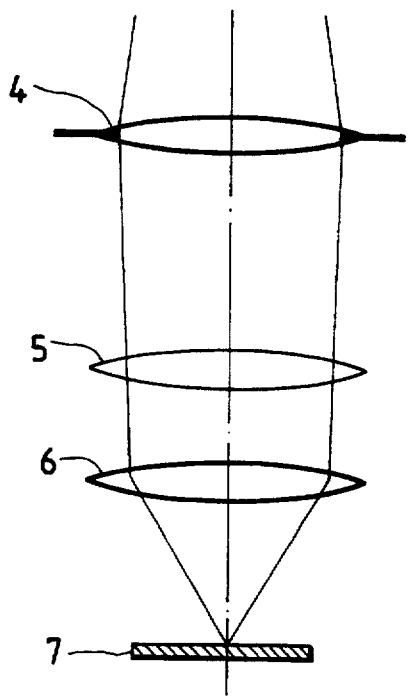
Figure 4D:
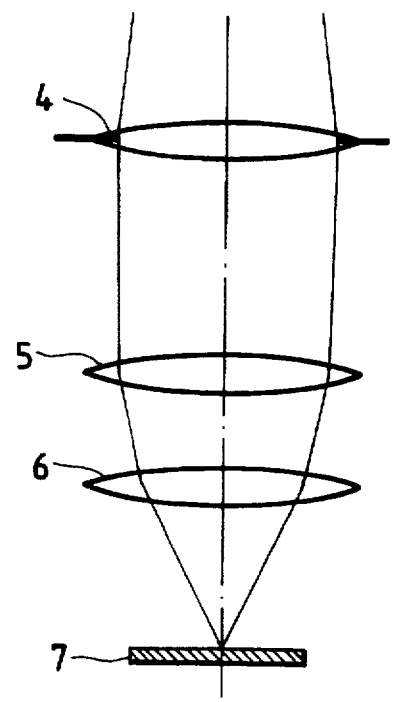

FIGS. 4A, 4B, 4C and 4D are lay diagrams showing the operation of the above described embodiment. In FIGS. 4A, 4B, 4C and 4D, the lenses to be driven are expressed with thick lines and the lens not to be driven is expressed with a thin line. The condenser lens unit is composed of three lenses, and when the lens unit is used for enlargement, the condenser lens 4 and the condenser lens 5 are driven in an interlocking motion as shown in FIG. 4A. When the lens unit is used for reduction, the condenser lens 6 is driven independently as shown in FIG. 4B. In the case of a reducing use, as shown in FIGS. 4C and 4D, besides the condenser lens 6, the condenser lens 4, or both condenser lens 4 and condenser lens 5, can be driven simultaneously.

Even in a case where an equivalent objective forward magnetic lens is used in the last stage of an illumination system, the above-mentioned functions can be achieved with the constitution of the condenser lens unit as described in the above without any modification.

What is claimed is:

1. A field-emission transmission electron microscope comprising;
   a field-emission cathode;
   an electrostatic lens for extracting electrons from the field-emission cathode and for accelerating the electrons to a predetermined accelerating voltage; and
   first, second and third magnetic condenser lenses disposed between a specimen to be illuminated and said electrostatic lens, wherein the distances between upper side magnetic poles and lower side magnetic poles and the diameters of apertures on the upper side magnetic poles and the lower side magnetic poles are set to satisfy the expressions (S2+D2)<(S1+D1) and (S2+D2)<(S3+D3), wherein S1, S2 and S3 indicate the distances between the upper side magnetic poles and the lower side magnetic poles of the firsts, second and third magnetic condenser lenses, respectively, and D1, D2 and D3 indicate the average values of apertures on the upper side magnetic poles and on the lower side magnetic poles of the first, second and third magnetic condenser lenses, respectively.

2. An operation method of a field-emission transmission electron microscope, comprising the steps of:
   providing the field-emission transmission electron microscope with an electrostatic lens for extracting electrons from a field-emission cathode and for accelerating the electrons to a predetermined accelerating voltage; and a magnetic condenser lens unit including first, second and third magnetic condenser lenses disposed between said electrostatic lens and a specimen to be illuminated, wherein S1, S2 and S3 indicate the distances between upper side magnetic poles and lower side magnetic poles of the first, second and third magnetic condenser lenses, respectively; D1, D2 and D3 indicate the average diameters of apertures on the upper side magnetic poles and the lower side magnetic poles of the first, second and third magnetic condenser lenses, respectively; and wherein the distances between the upper side magnetic poles and the lower side magnetic poles and the diameters of apertures on the upper side magnetic poles and the lower side magnetic poles are set to satisfy the expressions (S2+D2 )<(S1+D1) and (S2+D2)<(S3+D3); and
   driving the first and second magnetic condenser lenses when the magnetic condenser lens unit is used for enlargement of electron beam spot size.

3. An operation method of a field-emission transmission electron microscope, comprising the steps of:
   providing the field-emission transmission electron microscope with an electrostatic lens for extracting electrons from a field-emission cathode and for accelerating the electrons to a predetermined accelerating voltage, and a magnetic condenser lens unit including first, second and third magnetic condenser lenses disposed between a specimen to be illuminated and said electrostatic lens, wherein S1, S2 and S3 indicate the distances between upper side magnetic poles and lower side magnetic poles of the first, second and third magnetic condenser lenses, respectively, and D1, D2 and D3 indicate the average diameters of apertures on the upper side magnetic poles and on the lower side magnetic poles of the first, second and third equivalent magnetic condenser lenses, respectively, and wherein the distances between the upper side magnetic poles and the lower side magnetic poles and the diameters of the apertures on the upper side magnetic poles and the lower side magnetic poles are set to satisfy the expressions (S2+D2)<(S1+D1) and (S2+D2)<(S3+D3); and
   driving the third magnetic condenser lens when the magnetic condenser lens unit is used for reduction of electron beam spot size.

4. A field emission transmission electron microscope, comprising:
   a field emission cathode;
   an electrostatic lens for extracting electrons from the field emission cathode and for accelerating the electrons to a predetermined accelerating voltage;
   condenser lens means having first, second and third condenser lenses disposed between said electrostatic lens and a specimen to be illuminated, said second condenser lens being disposed at a position halfway between said first condenser lens and said specimen, and said third condenser lens being disposed between said second condenser lens and said specimen; and
   driving means for selectively driving said first, second and third condenser lenses, said driving means actuating said first condenser lens and said second condenser lens without actuating said third condenser lens when said condenser lens means is to be used for enlargement of electron beam spot size, and actuating said first condenser lens, said second condenser lens and said third condenser lens when said condenser lens means is to be used for reduction of electron beam spot size.

* * * * *